US008305767B2

(12) United States Patent
Nakamura et al.

(10) Patent No.: US 8,305,767 B2
(45) Date of Patent: Nov. 6, 2012

(54) PRINTED WIRING BOARD RELIABLY ACHIEVING ELECTRIC CONNECTION WITH ELECTRONIC COMPONENT

(75) Inventors: Naoki Nakamura, Kawasaki (JP); Shigeru Sugino, Kawasaki (JP); Ryo Kanai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1215 days.

(21) Appl. No.: 11/905,317

(22) Filed: Sep. 28, 2007

(65) Prior Publication Data

US 2008/0080153 A1 Apr. 3, 2008

(30) Foreign Application Priority Data

Sep. 29, 2006 (JP) ................................. 2006-269662

(51) Int. Cl.
*H05K 7/10* (2006.01)
*H05K 7/12* (2006.01)

(52) U.S. Cl. ......... 361/767; 361/794; 361/795; 361/818

(58) Field of Classification Search .......... 361/752–753, 361/792–795, 816–818
See application file for complete search history.

(56) References Cited

U.S. PATENT DOCUMENTS

| | | | | |
|---|---|---|---|---|
| 5,023,753 A * | 6/1991 | Abe | 361/782 |
| 5,252,782 A * | 10/1993 | Cantrell et al. | 174/387 |
| 6,356,451 B1 | 3/2002 | Nakagawa et al. | |
| 6,818,284 B2 | 11/2004 | Ono et al. | |
| 2002/0110697 A1 | 8/2002 | Ono et al. | |

FOREIGN PATENT DOCUMENTS

| | | |
|---|---|---|
| JP | 63-086595 | 4/1988 |
| JP | 64-2466 | 1/1989 |
| JP | 1-316989 | 12/1989 |
| JP | 2000-124612 | 4/2000 |
| JP | 2000-277927 | 10/2000 |
| JP | 2001-217514 | 8/2001 |
| JP | 2002-240192 | 8/2002 |
| JP | 2002-261402 | 9/2002 |
| JP | 2004-022977 | 1/2004 |
| JP | 2005-353714 | 12/2005 |
| JP | 2006-32622 | 2/2006 |

OTHER PUBLICATIONS

Japanese Office Action issued in corresponding Japanese Application No. 2006-269662 dated May 17, 2011.
Office Action dated Dec. 23, 2011 which issued in corresponding Taiwanese Patent Application No. 096135944 (6 pages) (1 pages English language Search Report).
Japanese Office Action issued on Jul. 17, 2012 in corresponding Japanese Patent Application No. 2011-158156.

* cited by examiner

*Primary Examiner* — Tuan T Dinh
(74) *Attorney, Agent, or Firm* — Staas & Halsey LLP

(57) ABSTRACT

Terminal pads are arranged on a first surface of the substrate for an electronic component to receive terminals of the electronic component. An electrically-conductive film is formed on a second surface defined on the back of the first surface over the back of a mounting area for the electronic component. The mounting area is contoured along the outer periphery of the arrangement of the terminal pads. The ratio of the area of the electrically-conductive material to the area of the surface of the substrate over the back of the mounting area is set appropriate to the ratio of the area of the electrically-conductive material to the area of the surface of the substrate over the mounting area for each electronic component. This results in suppression of flexure of the printed wiring board during reflow.

6 Claims, 12 Drawing Sheets

PRINTED WIRING BOARD RELIABLY ACHIEVING ELECTRIC CONNECTION WITH ELECTRONIC COMPONENT

BACKGROUND OF THE INVENTION

1. Field of the Invention

The present invention relates to a printed wiring board. In particular, the present invention relates to a printed wiring board utilized in a printed circuit board unit incorporated in a portable electronic apparatus, for example.

2. Description of the Prior Art

An electronic component is mounted on a printed wiring board. Terminal pads made of an electrically-conductive material are formed on the front and back surfaces of the substrate. The terminals of the electronic component are received on the terminal pads, respectively. The terminals of the electronic component are soldered to the terminal pads, for example.

Reflow is employed to solder the electronic component. Solder cream is printed on the printed wiring board. The terminals of the electronic component are set on the solder cream. The printed wiring board and the electronic component are then put into a reflow oven. Heat is applied to the solder cream. The application of heat causes flexure of the electronic component and/or the printed wiring board. This results in poor connection between the terminals of the electronic component and the terminal pads.

A copper film overspreads the front surface of the substrate outside the terminal pads and the wiring pattern as disclosed in Japanese Patent Application Publication No. 1-316989, for example. If the ratio of copper area on the front surface of the substrate is in this manner set equal to that on the back surface of the substrate, the printed wiring board is prevented from flexure after the reflow. However, poor connection may be caused between the terminals of the electronic component and the terminal pads regardless of the equalization of the ratio of copper area between the entire front surface and the entire back surface of the substrate.

SUMMARY OF THE INVENTION

It is accordingly an object of the present invention to provide a printed wiring board capable of reliably preventing poor connection between terminals of an electronic component and terminal pads.

According to a first aspect of the present invention, there is provided a printed wiring board comprising: a substrate; terminal pads made of an electrically-conductive material, the terminal pads arranged on a first surface of the substrate for an electronic component to receive terminals of the electronic component; and an electrically-conductive film formed on a second surface defined on the back of the first surface over the back of a mounting area for the electronic component, the mounting area contoured along the outer periphery of the arrangement of the terminal pads, the area of the electrically-conductive film depending on the ratio of area of the electrically-conductive material to the area of the surface of the substrate within the mounting area.

The ratio is defined between the area of the surface of the substrate and the area of the electrically-conductive material over the mounting area in the printed wiring board. The electrically-conductive film is formed on the back of the mounting area in accordance with the ratio. The ratio of the area of the electrically-conductive material to the area of the surface of the substrate over the back of the mounting area is set appropriate to the ratio of the area of the electrically-conductive material to the area of the surface of the substrate over the mounting area for each electronic component. This results in suppression of flexure of the printed wiring board during reflow. Here, the electrically-conductive film may include predetermined repetitive patterns on the second surface of the substrate for adjustment of the ratio.

There is provided a method of making the printed wiring board. The method may comprise: forming terminal pads made of an electrically-conductive material on a first surface of a substrate, the terminal pads arranged for an electronic component to receive terminals of the electronic component; and forming an electrically-conductive film on a second surface defined on the back of the first surface over the back of a mounting area for the electronic component, the mounting area contoured along the outer periphery of the arrangement of the terminal pads, the area of the electrically-conductive film depending on the ratio of the area of the electrically-conductive material to the area of the surface of the substrate within the mounting area. In this case, the terminal pads and the electrically-conductive film may be formed together in one process or formed separately in different processes.

The printed wiring board may be employed in a specific printed circuit board unit. One or more electronic component is mounted on the first surface of the substrate in the printed circuit board unit. The printed wiring board is allowed to enjoy a suppressed flexure in the manner as described above, so that the terminals of each electronic component can reliably contact with the corresponding terminal pads. This results in a reliable prevention of poor connection between the terminals of the electronic component and the terminal pads. In addition, the printed circuit board unit may be incorporated in a specific electronic apparatus. The printed circuit board unit may be placed within the enclosure of the electronic apparatus. The electronic component may be a semiconductor chip package.

According to a second aspect of the present invention, there is provided a printed wiring board comprising: a substrate; terminal pads arranged on the surface of the substrate for an electronic component to receive terminals of the electronic component; a first insulating film extending on the surface of the substrate within a mounting area for the electronic component, the mounting area contoured along the outer periphery of the arrangement of the terminal pads, the first insulating film having a first thickness; and a second insulating film extending on the surface of the substrate outside the mounting area, the second insulating film having a second thickness smaller than the first thickness. The printed wiring board allows adjustment of the thermal expansion of the mounting area for each electronic component depending on the thickness and the area of the second insulating film. This results in suppression of flexure of the substrate.

In particular, the printed wiring board of this type may further comprise: a solder resist film formed on the surface of the substrate inside and outside the mounting area, the solder resist film having the second thickness; and a marking ink film overlaid on the surface of the solder resist film within the mounting area to establish the first thickness on the surface of the substrate. As well known, the marking ink film is in general utilized to write characters and/or symbols such as the identifier of the printed wiring board. Utilization of the marking ink film enables establishment of the insulating film having the first thickness on the substrate in a relatively facilitated manner without an additional production process.

Alternatively, the printed wiring board may further comprise: a solder resist film formed on the surface of the substrate inside and outside the mounting area, the solder resist film having the second thickness; and an insulating film overlaid on the surface of the solder resist film within the mounting area to establish the first thickness on the surface of the substrate, the insulating film having a coefficient of thermal expansion larger than the coefficients of thermal expansion of the substrate and an electrically-conductive material. In the case where the back of the mounting area exhibits a thermal expansion larger than that of the mounting area, the insulating film serves to suppress flexure of the substrate. The printed wiring board may further comprise: additional terminal pads arranged on the surface of the substrate for an additional electronic component or components to receive terminals of the electronic component or components; an additional first insulating film or films extending on the surface of the substrate within an additional mounting area or areas for the additional electronic component or components, the additional mounting area or areas contoured along the outer periphery of the arrangement of the terminal pads on the additional electronic component or components, the additional first insulating film or films having the first thickness; and an additional insulating film or films overlaid on the surface of the solder resist film within the additional mounting area or areas to establish the first thickness on the surface of the substrate, the insulating film or films having a coefficient of thermal expansion larger than coefficients of thermal expansion of the substrate and the electrically-conductive material. In this case, the insulating films may be made of a material different from that of the additional insulating film or films. The printed wiring board of this type is allowed to enjoy a fine adjustment of flexure for each electronic component.

Otherwise, the printed wiring board may further comprise: a solder resist film formed on the surface of the substrate inside and outside the mounting area, the solder resist film having the second thickness; and an insulating film overlaid on the surface of the solder resist film within the mounting area to establish the first thickness on the surface of the substrate, the insulating film having a coefficient of thermal expansion smaller than coefficients of thermal expansion of the substrate and an electrically-conductive material. In the case where the back of the mounting area exhibits a thermal expansion smaller than that of the mounting area, the insulating film serves to suppress flexure of the substrate. The printed wiring board may further comprise: additional terminal pads arranged on the surface of the substrate for an additional electronic component or components to receive terminals of the electronic component or components; an additional first insulating film or films extending on the surface of the substrate within an additional mounting area or areas for the additional electronic component or components, the additional mounting area or areas contoured along the outer periphery of the arrangement of the terminal pads on the additional electronic component or components, the additional first insulating film or films having the first thickness; and an additional insulating film or films overlaid on the surface of the solder resist film within the additional mounting area or areas to establish the first thickness on the surface of the substrate, the insulating film or films having a coefficient of thermal expansion smaller than coefficients of thermal expansion of the substrate and the electrically-conductive material. In this case, the insulating films may be made of a material different from that of the additional insulating film or films. The printed wiring board of this type is allowed to enjoy a fine adjustment of flexure for each electronic component.

There is provided a method of making the printed wiring board. The method may comprise: forming terminal pads on the surface of a substrate, the terminal pads arranged for an electronic component to receive terminals of the electronic component; forming a solder resist film on the surface of the substrate; and forming an insulating film on the surface of the solder resist film within a mounting area for the electronic component, the mounting area contoured along the outer periphery of the arrangement of the terminal pads.

The printed wiring board may be employed in a specific printed circuit board unit. One or more electronic component is mounted on the surface of the substrate in the printed circuit board unit. The printed wiring board is allowed to enjoy a suppressed flexure in the manner as described above, so that the terminals of each electronic component can reliably contact with the corresponding terminal pads. This results in a reliable prevention of poor connection between the terminals of the electronic component and the terminal pads. In addition, the printed circuit board unit may be incorporated in a specific electronic apparatus. The printed circuit board unit may be placed within the enclosure of the electronic apparatus. The electronic component may be a semiconductor chip package.

According to a third aspect of the present invention, there is provided a printed wiring board comprising a substrate; terminal pads arranged on a first surface of the substrate for an electronic component to receive terminals of the electronic component; a first insulating film extending in a specific area of a second surface defined on the back of the first surface over the back of a mounting area for the electronic component, the mounting area contoured along the outer periphery of the arrangement of the terminal pads, the first insulating film having a first thickness; and a second insulating film extending on the second surface outside the specific area, the second insulating film having a second thickness smaller than the first thickness. The printed wiring board allows adjustment of the thermal expansion of the specific area at the back of the mounting area for each electronic component depending on the thickness and the area of the first insulating film. This results in suppression of flexure of the substrate.

In particular, the printed wiring board of this type may further comprise: a solder resist film formed on the second surface of the substrate inside and outside the specific area, the solder resist film having the second thickness; and a marking ink film overlaid on the surface of the solder resist film within the specific area to establish the first thickness on the second surface of the substrate. Utilization of the marking ink film enables establishment of the insulating film having the first thickness on the substrate in a relatively facilitated manner without an additional production process.

Alternatively, the printed wiring board may further comprise: a solder resist film formed on the second surface of the substrate inside and outside the specific area, the solder resist film having the second thickness; and an insulating film overlaid on the surface of the solder resist film within the specific area to establish the first thickness on the second surface of the substrate, the insulating film having a coefficient of thermal expansion larger than the coefficients of thermal expansion of the substrate and an electrically-conductive material. In the case where the specific area exhibits a thermal expansion smaller than that of the mounting area, the insulating film serves to suppress flexure of the substrate. The printed wiring board may further comprise: additional terminal pads arranged on the surface of the substrate for an additional electronic component or components to receive terminals of the electronic component or components; an additional first insulating film or films extending on the surface of the substrate within an additional mounting area or areas for the additional electronic component or components, the additional mounting area or areas contoured along the outer periphery of the arrangement of the terminal pads on the additional electronic component or components, the additional first insulating film or films having the first thickness; and an additional insulating film or films overlaid on the surface of the solder resist film within the additional mounting area or areas to establish the first thickness on the surface of the substrate, the insulating film or films having a coefficient of thermal expansion larger than the coefficients of thermal expansion of the substrate and the electrically-conductive material. In this case, the insulating film may be made of a material different from that of the additional insulating film or films. The printed wiring board of this type is allowed to enjoy a fine adjustment of flexure for each electronic component.

Otherwise, the printed wiring board may further comprise: a solder resist film formed on the second surface of the substrate inside and outside the specific area, the solder resist film having the second thickness; and an insulating film overlaid on the surface of the solder resist film within the specific area to establish the first thickness on the second surface of the substrate, the insulating film having a coefficient of thermal expansion smaller than the coefficients of the thermal expansion of the substrate and an electrically-conductive material. In the case where the specific area exhibits a thermal expansion larger than that of the mounting area, the insulating film serves to suppress flexure of the substrate. The printed wiring board may further comprise: additional terminal pads arranged on the surface of the substrate for an additional electronic component or components to receive terminals of the electronic component or components; an additional first insulating film or films extending on the surface of the substrate within an additional mounting area or areas for the additional electronic component or components, the additional mounting area or areas contoured along the outer periphery of the arrangement of the terminal pads on the additional electronic component or components, the additional first insulating film or films having the first thickness; and an additional insulating film or films overlaid on the surface of the solder resist film within the additional mounting area or areas to establish the first thickness on the surface of the substrate, the insulating film or films having a coefficient of thermal expansion smaller than coefficients of thermal expansion of the substrate and the electrically-conductive material. In this case, the insulating film may be made of a material different from that of the additional insulating film or films. The printed wiring board of this type is allowed to enjoy a fine adjustment of flexure for each electronic component.

There is provided a method of making the printed wiring board. The method may comprise: forming terminal pads on a first surface of a substrate, the terminal pads arranged for an electronic component to receive the terminals of the electronic component; forming a solder resist film on a second surface defined on the back of the first surface; and forming an insulating film on the surface of the solder resist film within the back of a mounting area for the electronic component, the mounting area contoured along the outer periphery of the arrangement of the terminal pads.

The printed wiring board may be employed in a specific printed circuit board unit. One or more electronic component is mounted on the first surface of the substrate in the printed circuit board unit. The printed wiring board is allowed to enjoy a suppressed flexure in the manner as described above, so that the terminals of each electronic component can reliably contact with the corresponding terminal pads. This results in a reliable prevention of poor connection between the terminals of the electronic component and the terminal pads. In addition, the printed circuit board unit may be incorporated in a specific electronic apparatus. The printed circuit board unit may be placed within the enclosure of the electronic apparatus. The electronic component may be a semiconductor chip package.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
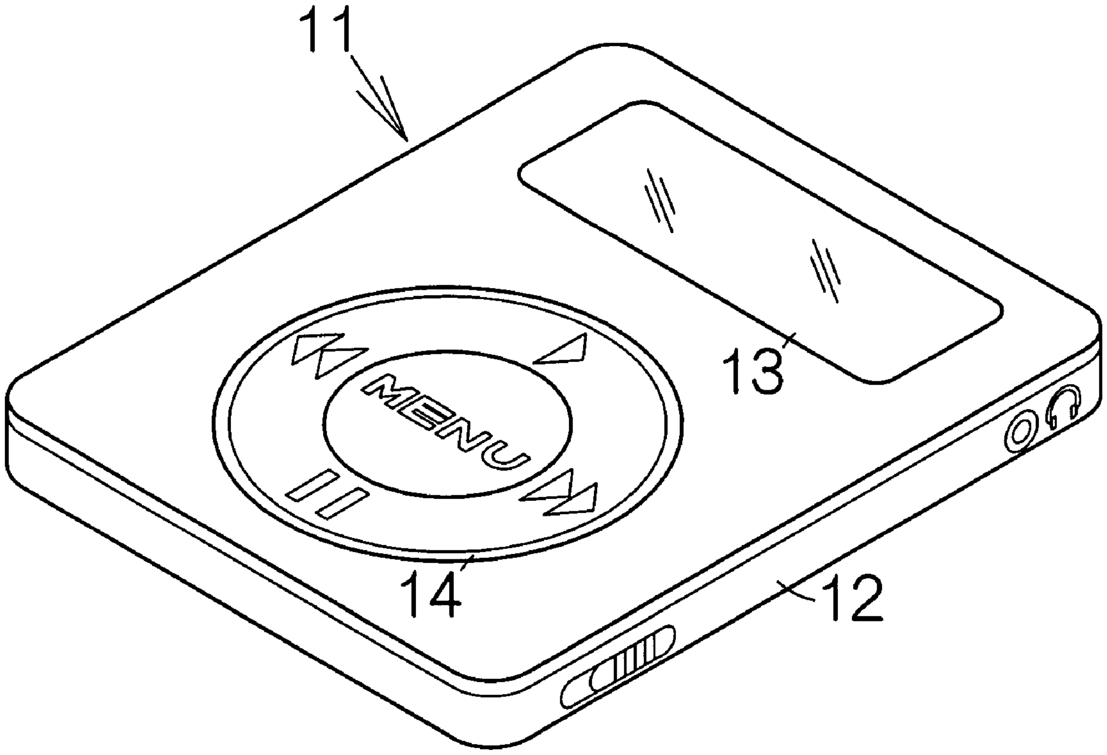
FIG. 1 is a perspective view schematically illustrating the structure of a MP3 (MPEG-1 Audio Layer-3) player as an electronic apparatus according to a first embodiment of the present invention.

FIG. 1 illustrates the structure of an MP3 (MPEG-1 Audio Layer-3) player as an electronic apparatus according to a first embodiment of the present invention. The MP3 player 11 includes an enclosure 12. A printed circuit board unit is placed within the enclosure 12. The printed circuit board unit will be described later. A display panel 13 and an operating piece 14 are embedded in the enclosure 12. The display panel 13 serves to display the track number and other information of stored songs or the like, for example. A user manipulates the operating piece 14 to store a song or the like in the MP3 player 11. A user also manipulates the operating piece 14 to choose a song or the like to be played.

Figure 2:
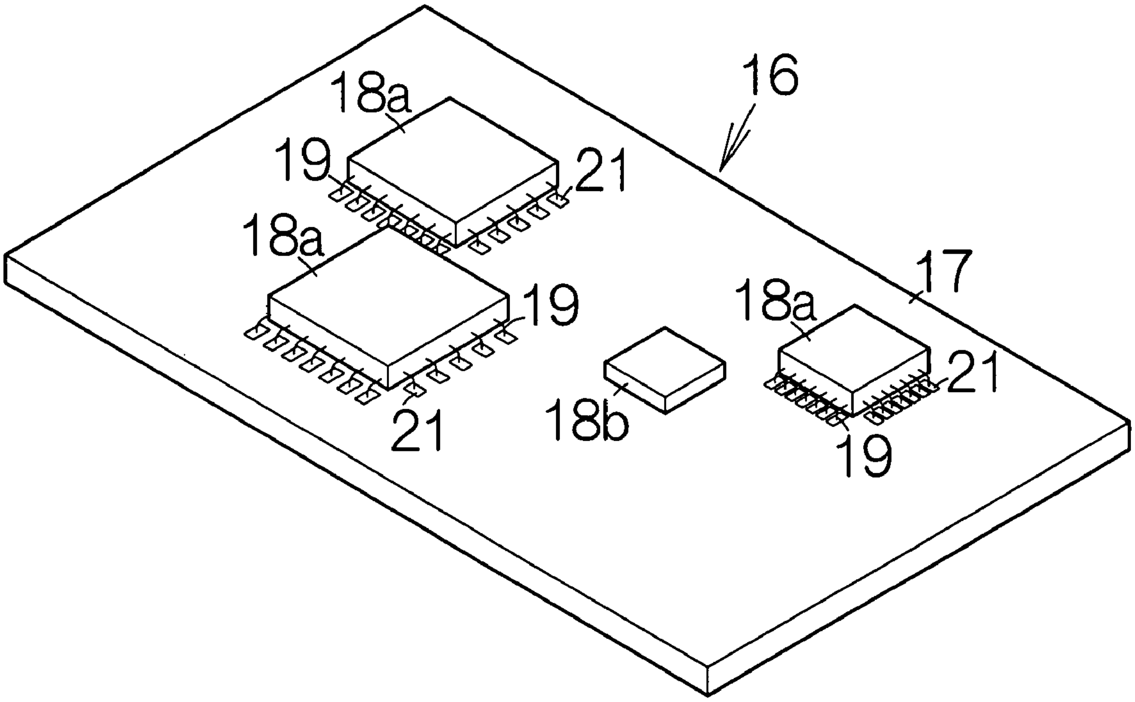
FIG. 2 is an enlarged perspective view schematically illustrating the front surface of a printed circuit board unit incorporated in the MP3 player.
Figure 3:
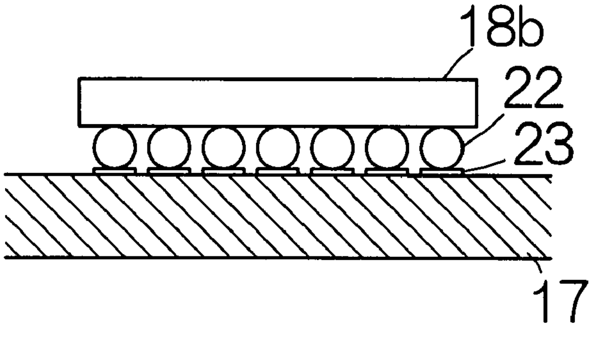
FIG. 3 is a vertical sectional view schematically illustrating terminals of a semiconductor chip package.

As shown in FIG. 2, a printed circuit board unit 16 includes a printed wiring board 17. Electronic components or semiconductor chip packages 18*a*, 18*b* are mounted on the front surface of the printed wiring board 17. The individual semiconductor chip package 18*a* includes terminals 19. The individual terminal 19 is received on a corresponding one of terminal pads 21. Here, the semiconductor chip package 18*b* has the structure of a so-called BGA (Ball Grid Array). The semiconductor chip package 18*b* thus has terminals 22 arranged between the semiconductor chip package 18*b* and the printed wiring board 17, as is apparent from FIG. 3. The individual terminal 22 of the semiconductor chip package 18*b* is received on a corresponding one of terminal pads 23.

Figure 4:
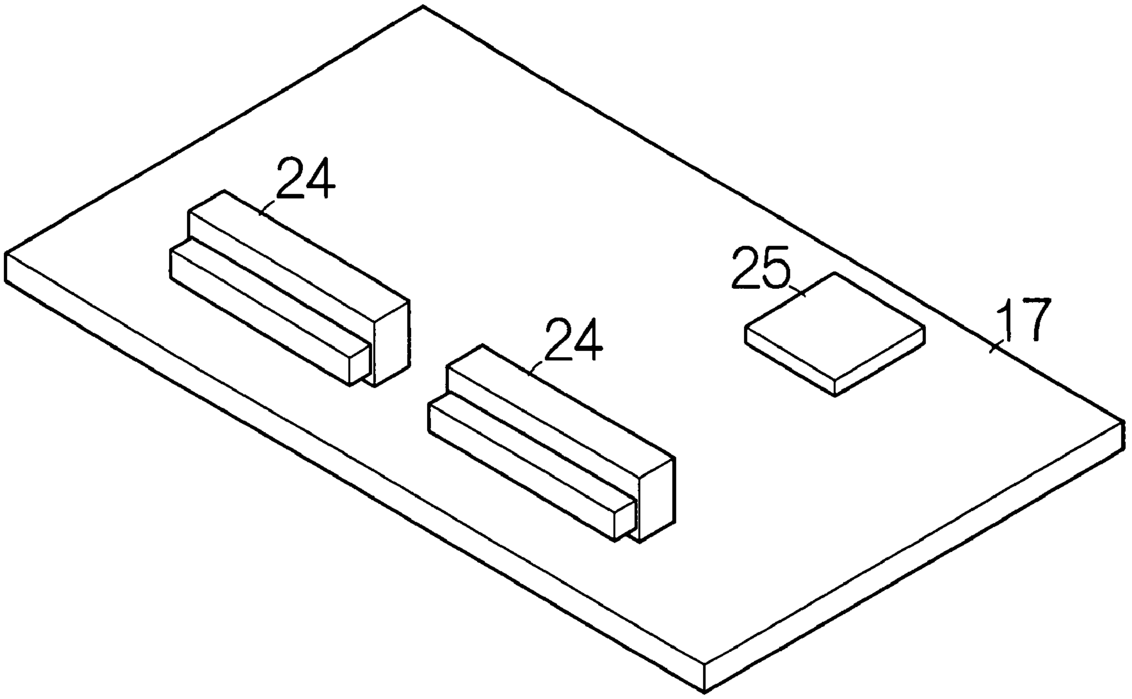
FIG. 4 is an enlarged perspective view schematically illustrating the back surface of the printed circuit board unit incorporated in the MP3 player.
Figure 5:
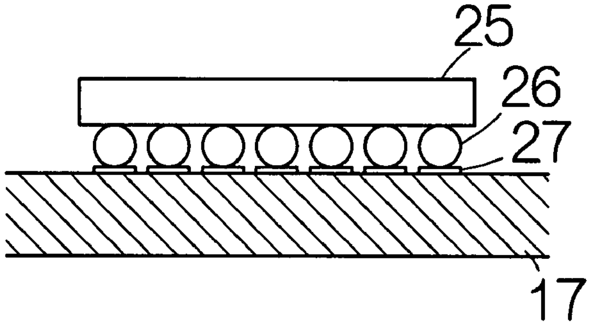
FIG. 5 is a vertical sectional view schematically illustrating the terminals of a semiconductor chip package.

As shown in FIG. 4, electronic components or connectors 24 and a semiconductor chip package 25 are mounted on the back surface of the printed wiring board 17. The semiconductor chip package 25 has the structure of a so-called BGA (Ball Grid Array). The semiconductor chip package 25 thus has terminals 26 arranged between the semiconductor chip package 25 and the printed wiring board 17, as is apparent from FIG. 5. The individual terminal 26 of the semiconductor chip package 25 is received on a corresponding one of terminal pads 27.

Figure 6:
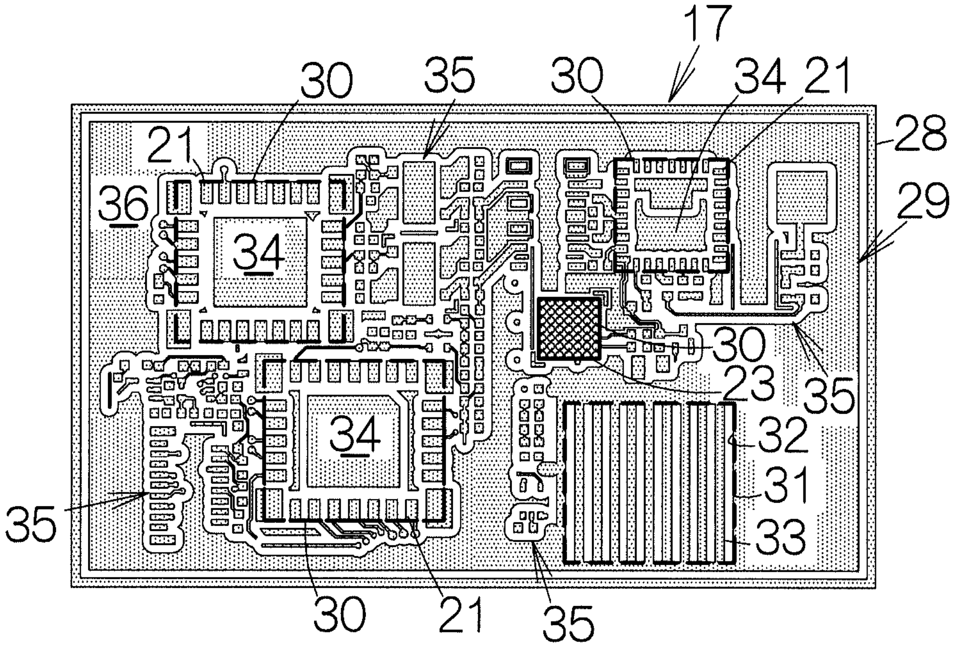
FIG. 6 is a plan view schematically illustrating the structure of an electrically-conductive film on the front surface of a printed wiring board.

As shown in FIG. 6, the printed wiring board 17 includes a substrate 28. The substrate 28 is made of a glass fiber-filled resin, for example. An electrically-conductive film 29 is formed on the front surface of the substrate 28. The electrically-conductive film 29 is made of an electrically-conductive material such as copper, for example.

The aforementioned terminal pads 21, 23 are defined in the electrically-conductive film 29. The terminal pads 21, 23 are arranged on the front surface of the substrate 28 for each of the semiconductor chip packages 18*a*, 18*b*. The terminal pads 21 are arranged along a rectangular outline for the semiconductor chip package 18*a*. The terminal pads 23 are arranged in a matrix within a rectangular outline for the semiconductor chip package 18*b*. A first mounting area 30 for an electronic component is contoured on the front surface of the printed wiring board 17 along the outer periphery of each arrangement of the terminal pads 21, 23.

A first backside area 31 is also defined in the electrically-conductive film 29. The first backside area 31 is defined on the back of the semiconductor chip package 25. Voids 32 are defined in the electrically-conductive film 29 within the first backside area 31 in predetermined repetitive patterns. Here, stripes of electrically-conductive film piece 33 are arranged at predetermined intervals. The individual electrically-conductive film piece 33 having a predetermined width extends along a straight line in parallel with one side of the rectangle.

An overspreading film 34 is defined in the electrically-conductive film 29 on the front surface of the substrate 28. The overspreading film 34 covers overall over an area inside the arrangement of the terminal pads 21. An overspreading film 36 is also defined on the front surface of the substrate 28. The overspreading film 36 covers overall over an area outside wiring patterns 35 and the first backside area 31. The front surface of the substrate 28 is in this manner covered overall with an electrically-conductive material.

Figure 7:
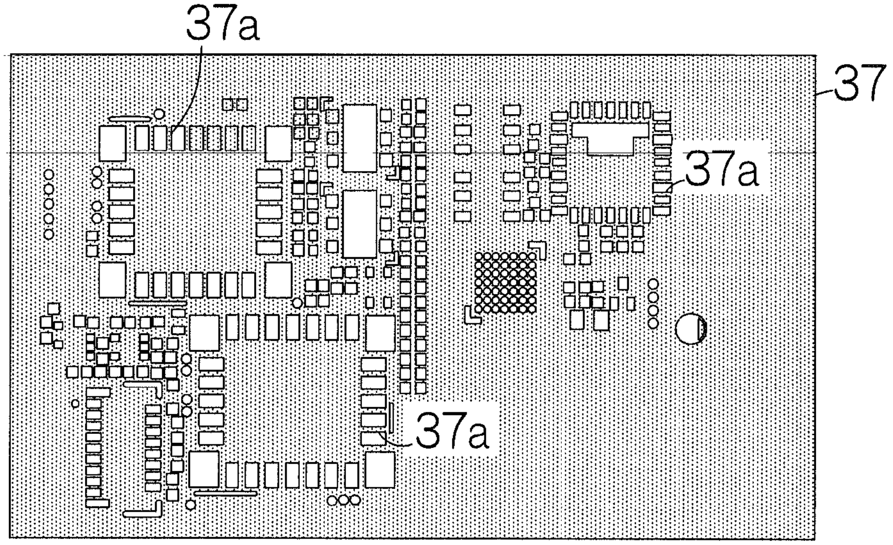
FIG. 7 is a plan view schematically illustrating the structure of a solder resist film formed on the front surface of the printed wiring board.

As shown in FIG. 7, a solder resist film 37 is also formed on the front surface of the substrate 28 over a predetermined area. The solder resist film 37 is overlaid on the exposed surface of the substrate 28 and the electrically-conductive film 29. Voids 37*a* are defined in the solder resist film 37 at predetermined areas. The terminal pads 21 of the first mounting areas 30 and the terminal pads of the wiring pattern 35 are exposed in the voids 37*a*. The solder resist film 37 may be made of an insulating material such as an epoxy resin, for example. The solder resist film 37 is overlaid on the first backside area 31.

Figure 8:
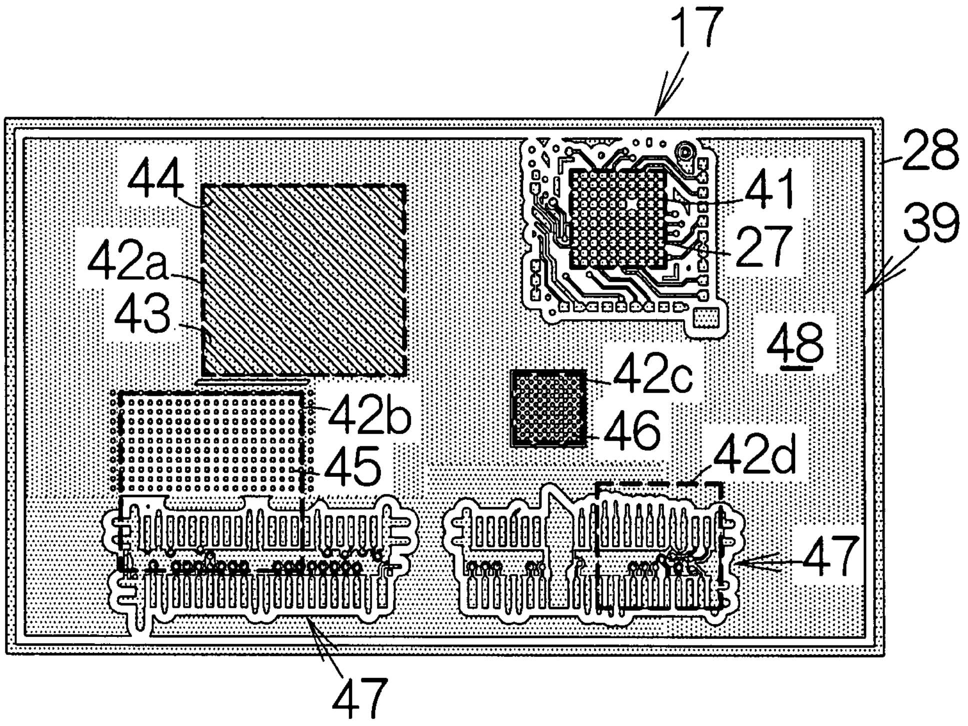
FIG. 8 is a plan view schematically illustrating an electrically-conductive film on the back surface of the printed wiring board.

As shown in FIG. 8, an electrically-conductive film 39 is formed on the back surface of the substrate 28. The electrically-conductive film 39 is made of an electrically-conductive material such as copper in the same manner as described above, for example. The aforementioned terminal pads 27 are defined in the electrically-conductive film 39. The terminal pads 27 are arranged in a matrix within a rectangular outline. A second mounting area 41 for an electronic component is contoured on the back surface of the printed wiring board 17 along the outer periphery of the arrangement of the terminal pads 27. The aforementioned first backside area 31 is defined on the back of the second mounting area 41.

Second backside areas 42*a*, 42*b*, 42*c*, 42*d* are defined in the electrically-conductive film 39. Each of the second backside areas 42*a*-42*d* is defined on the back of the corresponding first mounting area 30. Voids 43 are defined in the electrically-conductive film 39 within the second backside area 42*a* in predetermined repetitive patterns. Stripes of electrically-conductive film piece 44 are arranged within the second backside area 42*a* at predetermined intervals. The individual electrically-conductive film piece 44 having a predetermined width extends along a straight line in parallel with the diagonal line of a rectangular outline. Voids 45 are arranged in lines in parallel with one side of a rectangular outline within the second backside area 42*b*. Voids 46 are arranged in lines in parallel with the diagonal line of a rectangular outline within the backside area 42*c*. The voids 45, 46 may take the shape of a rectangle, a circle, or the like. The second backside area 42*b* partly defines a wiring pattern 47. The second backside area 42*d* defines nothing but a wiring pattern 47.

An overspreading film 48 is defined in the electrically-conductive film 39 on the back surface of the substrate 28. The overspreading film 48 covers overall over an area outside the second backside areas 42*a*-42*d* and the wiring patterns 47. The back surface of the substrate 28 is covered overall with an electrically-conductive material.

Figure 9:
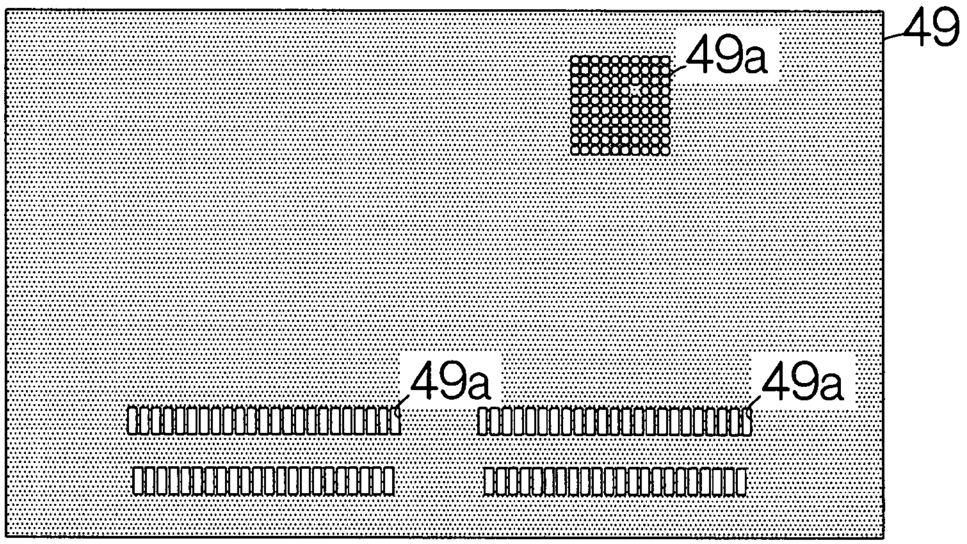
FIG. 9 is a plan view schematically illustrating a solder resist film formed on the back surface of the printed wiring board.

As shown in FIG. 9, a solder resist film 49 is also formed on the back surface of the substrate 28 over a predetermined area. The solder resist film 49 is overlaid on the exposed surface of the substrate 28 and the electrically-conductive film 39. Voids 49*a* are defined in the solder resist film 49 at predetermined areas. The terminal pads 27 of the second mounting area 41 and terminal pads for the connectors 24 are exposed in the voids 49*a*. The solder resist film 49 may be made of an insulating material such as an epoxy resin, for example. The solder resist film 49 is overlaid on the second backside areas 42*a*-42*d* at a position outside the terminal pads for the connectors 24.

In the printed wiring board 17, the ratio of the area of the electrically-conductive film 39 to the area of the surface of the substrate 28 within the second backside area 42*a*-42*d* is set in accordance with the ratio of the area of the electrically-conductive film 29 to the area of the surface of the substrate 28 within the corresponding first mounting area 30. Specifically, the ratio of copper area in the second backside area 42a-42d is set equal to the ratio of copper area in the corresponding first mounting area 30. Likewise, the ratio of the area of the electrically-conductive film 29 to the area of the surface of the substrate 28 within the first backside area 31 is set in accordance with the ratio of the area of the electrically-conductive film 39 to the area of the surface of the substrate 28 within the corresponding second mounting area 41. Specifically, the ratio of copper area in the first backside area 31 is set equal to the ratio of copper area in the corresponding second mounting area 41. The intervals and/or the widths of the electrically-conductive film pieces 33, 44 may be adjusted in the first backside area 31 and the second backside area 42a for the equalization, respectively. Likewise, the dimensions of the voids 45, 46 and/or the intervals of the lines of the voids 45, 46 may be adjusted in the second backside areas 42b, 42c, respectively.

The substrate 28 is first prepared to make the printed wiring board 17. So-called subtractive process is employed to form the electrically-conductive films 29, 39 on the front and back surfaces of the substrate 28, respectively. Copper foils are respectively applied to the front and back surfaces of the substrate 28 to form the electrically-conductive films 29, 39. Resists are formed on the surfaces of the copper foils. The resists are respectively patterned in the shape of the electrically-conductive films 29, 39. The solder resist films 37, 49 are subsequently formed on the front and back surfaces of the substrate 28, respectively.

Now, assume that the semiconductor chip packages 18a, 18b, 25 and the connectors 24 are to be mounted on the printed wiring board 17. The aforementioned electrically-conductive films 29, 39 are previously formed on the front and back surfaces of the printed wiring board 17, respectively. Plating process is employed to form the electrically-conductive films 29, 39, for example. An overspreading film made of copper is formed on the entire surface of the substrate 28. A photoresist film is formed on the surface of the overspreading film, for example. Voids are defined in the photoresist film. Voids are patterned in accordance with the contours of the electrically-conductive films 29, 39. When the electrically-conductive film is partly removed at the voids, the terminal pads 21, 23, 27 and the first and second backside areas 31, 42a-42d appear in the electrically-conductive films 29, 39. The solder resist films 37, 49 are then formed on the front and back surfaces of the substrate 28, respectively.

Solder cream is applied to the front surface of the printed wiring board 17. The solder cream may be printed on the front surface of the printed wiring board 17. The semiconductor chip packages 18a, 18b are subsequently placed on the front surface of the printed wiring board 17. The printed wiring board 17 and the semiconductor chip packages 18a, 18b are put into a reflow oven. Heat is applied to the solder cream. The terminals are wrapped in the solder cream on the terminal pads 21, 23, for example. The printed wiring board 17 and the semiconductor chip packages 18a, 18b are then taken out of the reflow oven. The solder is cooled, so that the solder gets solidified. The semiconductor chip packages 18a, 18b are in this manner mounted on the front surface of the printed wiring board 17. The connectors 24 and the semiconductor chip package 25 are likewise mounted on the back surface of the printed wiring board 17.

The front and back surfaces of the printed wiring board 17 are covered overall with the electrically-conductive films 29, 39, respectively, as described above. Accordingly, the ratio of copper area on the front surface is set equal to the ratio of copper area on the back surface in the printed wiring board 17. This results in minimization of flexure in the printed wiring board 17 after the reflow. The flexure may fall below 0.5%-1.0%, for example. Specifically, the printed wiring board 17 should be prevented from flexure exceeding 0.5 mm-1.0 mm for the length of 100 mm, approximately.

The ratio of copper area in the first mounting area 30 is set equal to the ratio of copper area in the corresponding second backside area 42a, 42b, 42c, 42d for each of the semiconductor chip packages 18a, 18b in the printed wiring board 17. The ratio of copper area in the second mounting area 41 is set equal to the ratio of copper area in the corresponding first backside area 31. This results in suppression of flexure of the printed wiring board 17 during the application of heat in the reflow oven. Accordingly, each of the terminals 19, 22 of the semiconductor chip packages 18a, 18b reliably contacts with the corresponding one of the terminal pads 21, 23. Poor connection is avoided in this manner.

Figure 10:
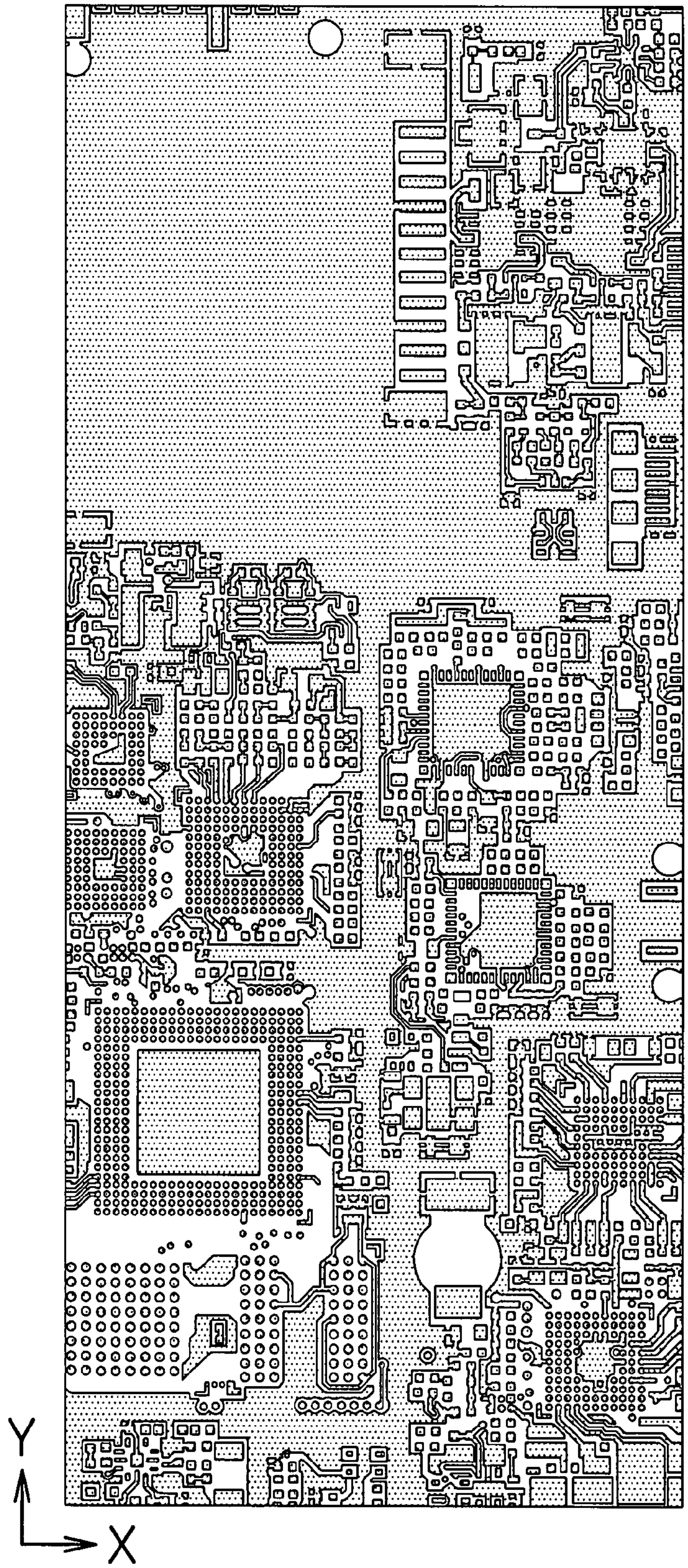
FIG. 10 is a plan view schematically illustrating the front surface of a substrate utilized in a simulation for observation of curvature of the substrate.
Figure 11:
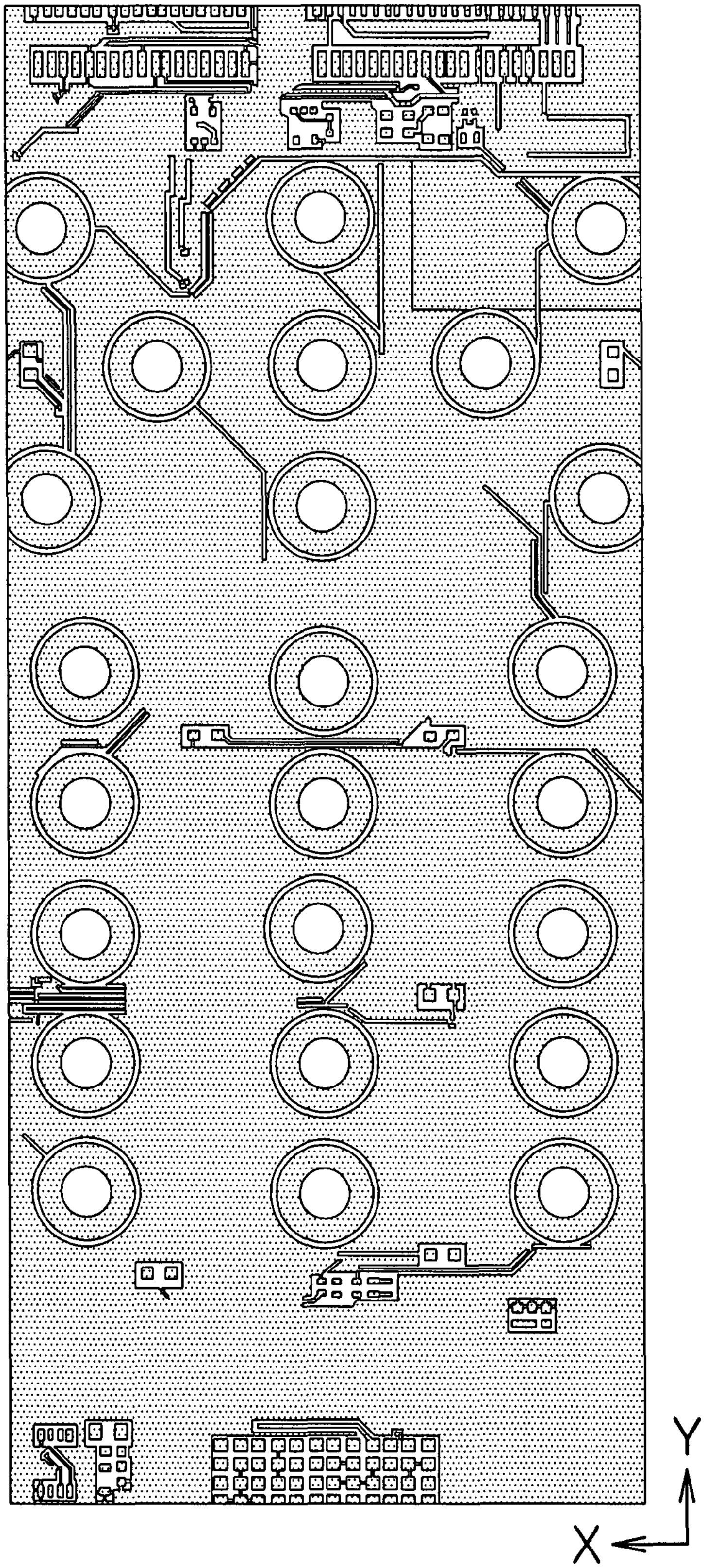
FIG. 11 is a plan view schematically illustrating the back surface of the substrate utilized in the simulation for observation of curvature of the substrate.
Figure 12:
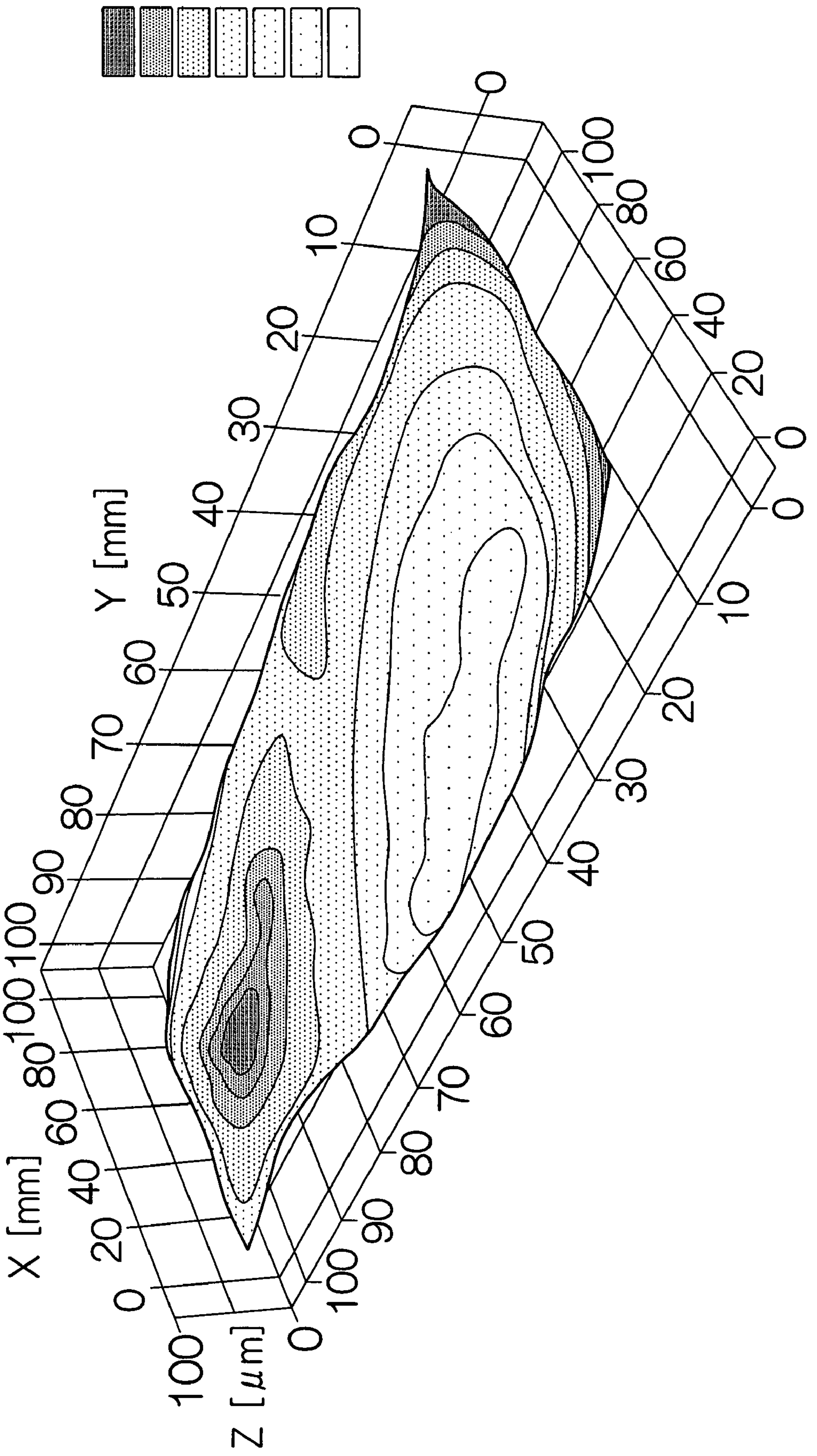
FIG. 12 is a three-dimensional analytical diagram showing curvature of the substrate resulting from the simulation.

Here, the inventors have observed flexure of a printed wiring board during reflow based on a computer simulation. As shown in FIGS. 10 and 11, an electrically-conductive film was defined on the front and back surfaces of the substrate in the simulation software. Solder cream was applied to the front surface of the printed wiring board. The simulation has revealed that flexure of approximately several tens μm is locally caused for the length of 100 mm in the printed wiring board, as shown in FIG. 12. Such flexure causes a failure in contact between the terminal or terminals of an electronic component and terminal pad or pads on the substrate. When the reflow has been completed, poor connection or a defect in electric conduction is caused between the terminal or terminals of the electronic component and the terminal pad or pads on the substrate. It should be noted that the thickness of the substrate was set at 0.6 [mm]. The thickness of the electrically-conductive films and the solder resist film was set at 30 [μm]. The thickness of the solder cream was set at 120 [μm]. Increase in the density of dots denotes rise in the altitude or level of the printed wiring board in FIG. 12. The rise in the altitude corresponds to increase in the value of the Z coordinate.

Figure 13:
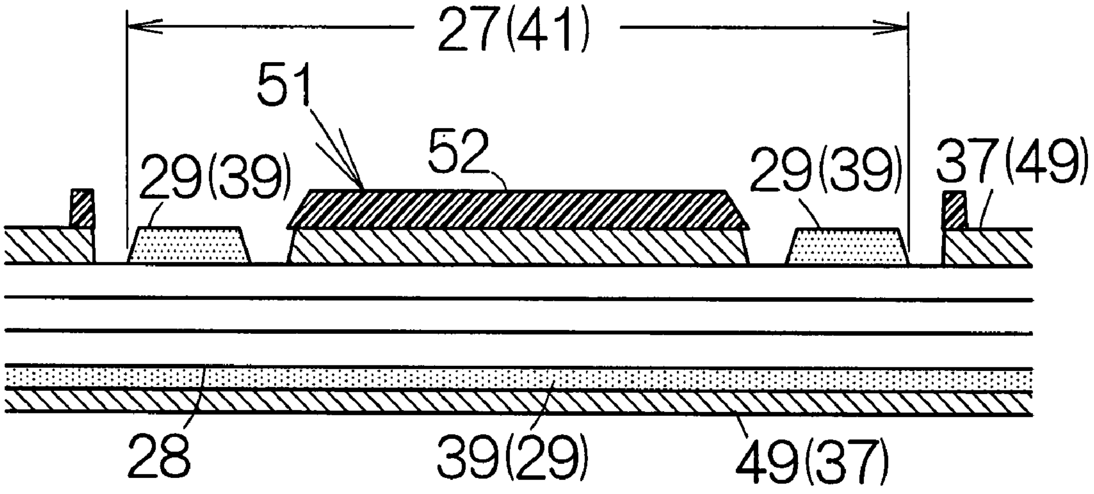
FIG. 13 is a partial vertical sectional view of the printed wiring board.
Figure 14:
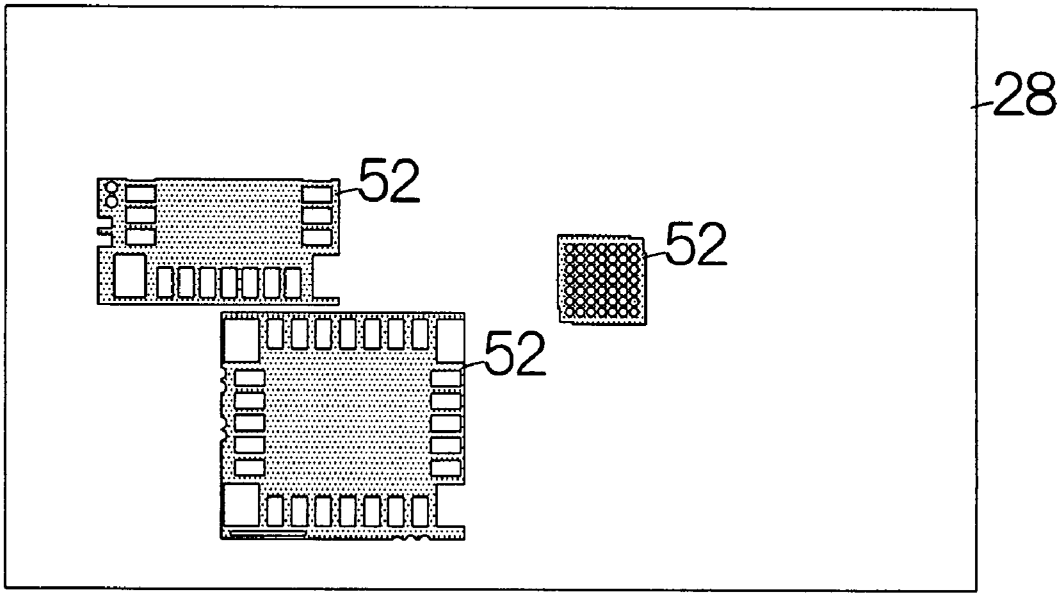
FIG. 14 is a plan view schematically illustrating the structure of a marking ink film formed on the front surface of the printed wiring board.
Figure 15:
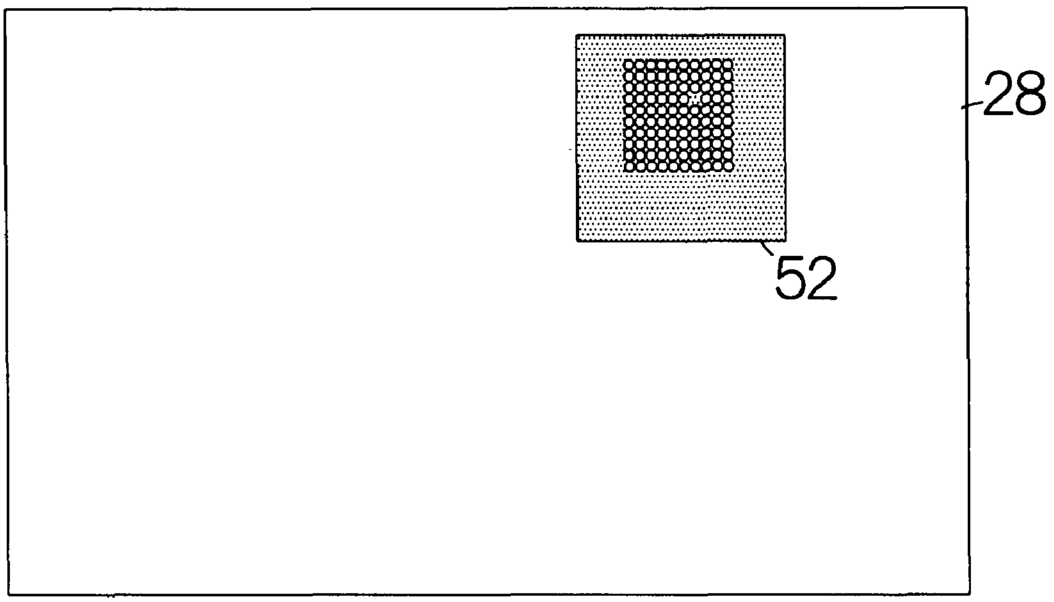
FIG. 15 is a plan view schematically illustrating the structure of a marking ink film formed on the back surface of the printed wiring board.

As shown in FIG. 13, an insulating film 51 may be formed in the printed wiring board 17 within the first mounting area 30 and/or the second mounting area 41, for example. The insulating film 51 may have a thickness (first thickness) larger than the thickness (second thickness) of the solder resist film 37, 49, for example. A marking ink film 52 may be formed on the surface of the aforementioned solder resist film 37, 49 to establish the insulating layer 51. The marking ink film 52 may be printed on the surface of the solder resist film 37, 49. The extent of the marking ink film 52 corresponds to the extent of the insulating film 51, as shown in FIGS. 14 and 15, for example. The marking ink film 52 may be made of an epoxy resin colored white or the like, for example. As well known, the marking ink film 52 is in general utilized to write characters and/or symbols such as the identifier of the printed wiring board 17. In this case, the ratio of copper area in the first mounting area 30 may or may not be set equal to that in the corresponding second backside area 42a-42d in the same manner as described above. Likewise, the ratio of copper area in the second mounting area 41 may or mat not be set equal to that in the corresponding first backside area 31 in the same manner as described above.

In general, an epoxy resin utilized to form the solder resist films 37, 49 and the marking ink film 52 has a larger coefficient of thermal expansion (=29.5 [ppm/° C.]) as compared with the coefficient of thermal expansion of the electrically-conductive films 29, 39 made of copper (=16.6 [ppm/° C.]) and the coefficient of thermal expansion of the substrate 28 (=14-22 [ppm/° C.]). Here, the terminal pads 21, 23, 27 are exposed in the first and second mounting areas 30, 41 in the solder resist films 37, 49. The second backside areas 42_a_-42_d_ and the first backside area 31 along with their peripheries are completely covered with the solder resist films 37, 49, respectively. The first and second mounting areas 30, 41 exhibit thermal expansions smaller than those of the second backside areas 42_a_-42_d_ and the first backside area 31. The marking ink films 52 respectively overlaid on the first and second mounting areas 30, 41 serve to increase the thermal expansion of the first and second mounting areas 30, 41. This results in prevention of flexure of the substrate 28 at the first and second mounting areas 30, 41.

Figure 16:
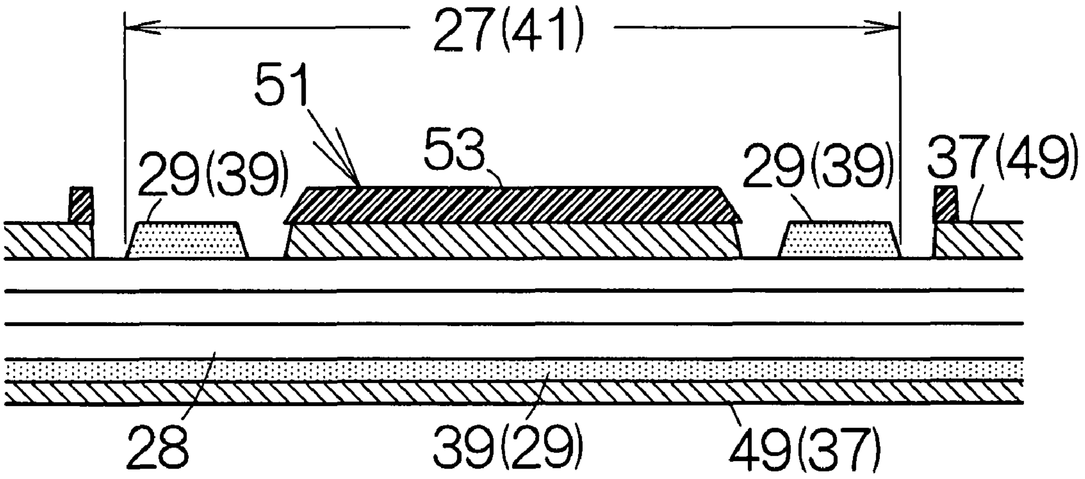
FIG. 16 is a partial vertical sectional view of the printed wiring board.

As shown in FIG. 16, an insulating layer 53 may be formed on the surface of the solder resist film 37, 49 in place of the aforementioned marking ink film 52 in the printed wiring board 17, for example. The insulating layer 53 may have a coefficient of thermal expansion larger than those of the electrically-conductive films 29, 39 and the substrate 28. The insulating film 53 may be made of one of resin materials listed in the following table, for example.

TABLE 1

| Resin Material | Coefficient of Thermal Expansion [ppm/° C.] |
|---|---|
| Epoxy Resin | 30-70 |
| Phenol Resin | 25-32 |
| Polyimide | 20 |
| Acrylic Resin | 80 |
| Melamine Resin | 20-40 |
| Vinyl Chloride | 60 |
| Silicone Resin | 780 |
| Fluororesin (PTFE) | 80 |
| Polyamide-imide | 40 |

The thickness and the area of the insulating film 53 may be adjusted in the first and second mounting areas 30, 41. In addition, silica ($SiO_2$) filler may be contained in the insulating film 53, for example. Since the silica filler has a smaller coefficient of thermal expansion (=0.4 [ppm/° C.]), the coefficient of thermal expansion of the insulating film 53 may be adjusted depending on the content of the silica filler. It should be noted that in the case where the first and second mounting areas 30, 41 exhibit a thermal expansion larger than those of the second backside areas 42_a_-42_d_ and the first backside area 31, the insulating films 53 having a coefficient of thermal expansion smaller than those of the electrically-conductive films 29, 39 and the substrate 28 may be formed on the surface of the solder resist film 37, 49 in the first and second mounting area 30, 41.

Figure 17:
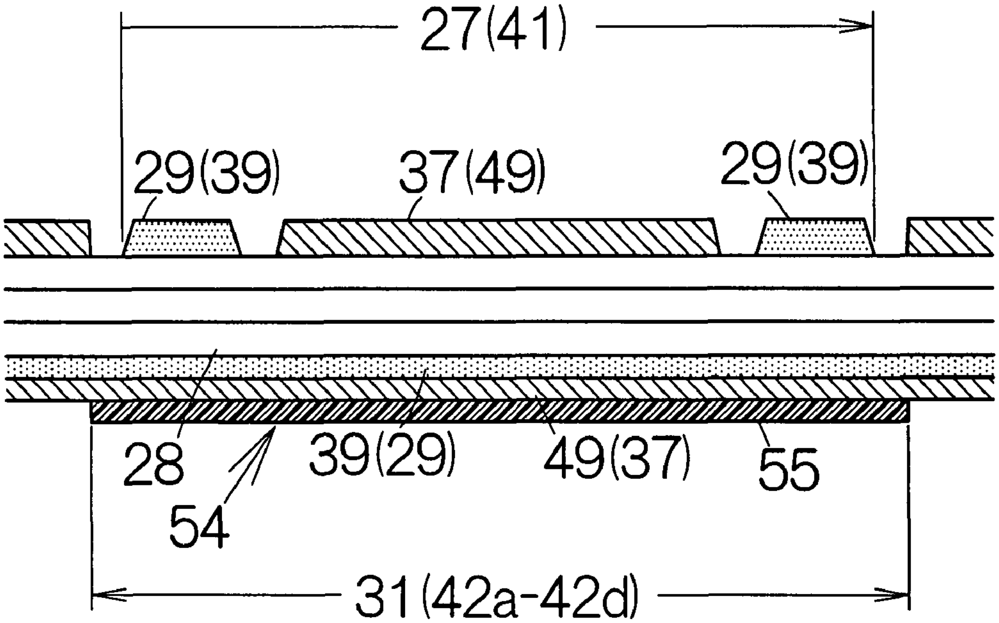
FIG. 17 is a partial vertical sectional view of the printed wiring board.
Figure 18:
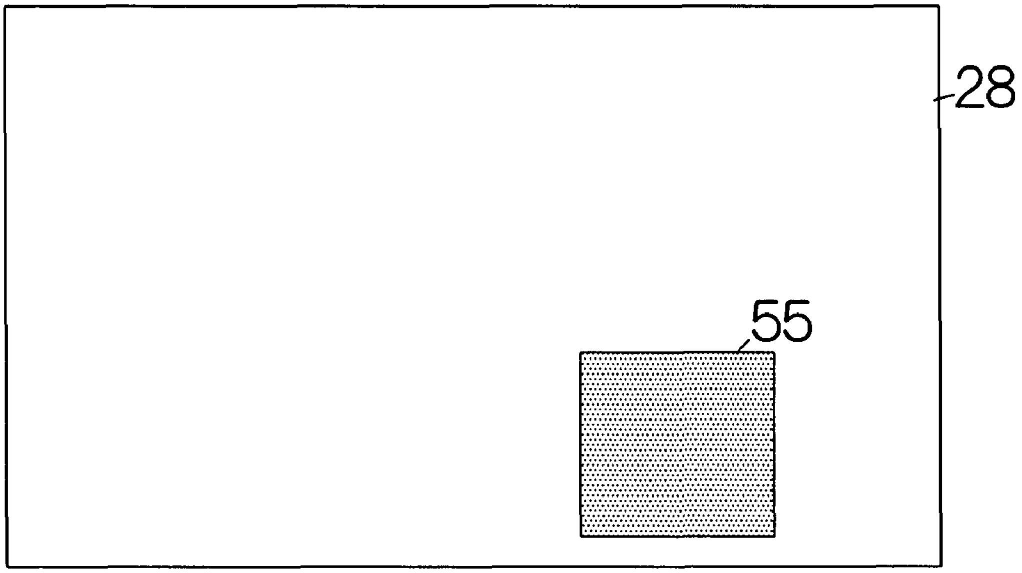
FIG. 18 is a plan view schematically illustrating the structure of an insulating film formed on the front surface of the printed wiring board.
Figure 19:
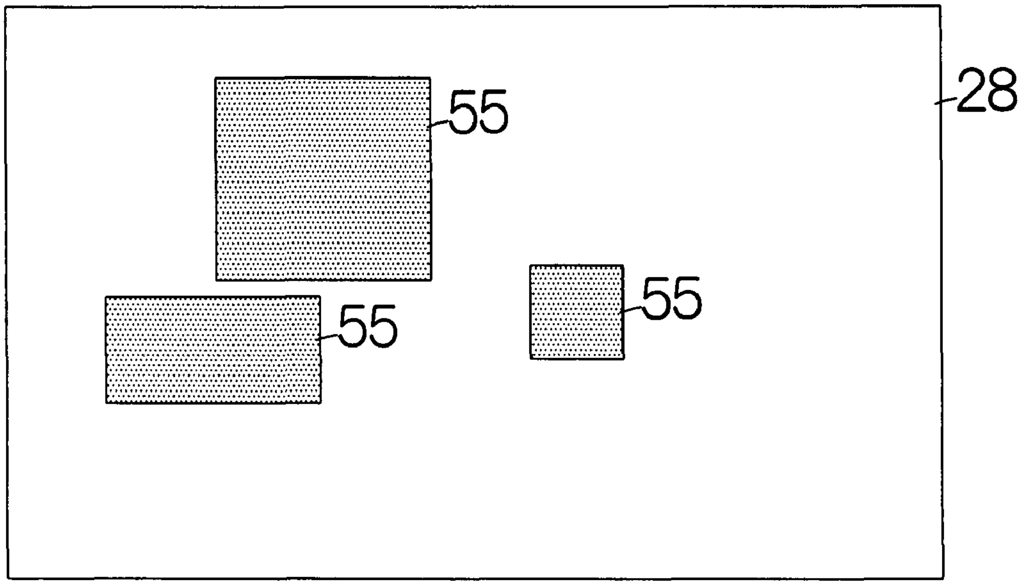
FIG. 19 is a plan view schematically illustrating the structure of an insulating film formed on the back surface of the printed wiring board.
Figure 20:
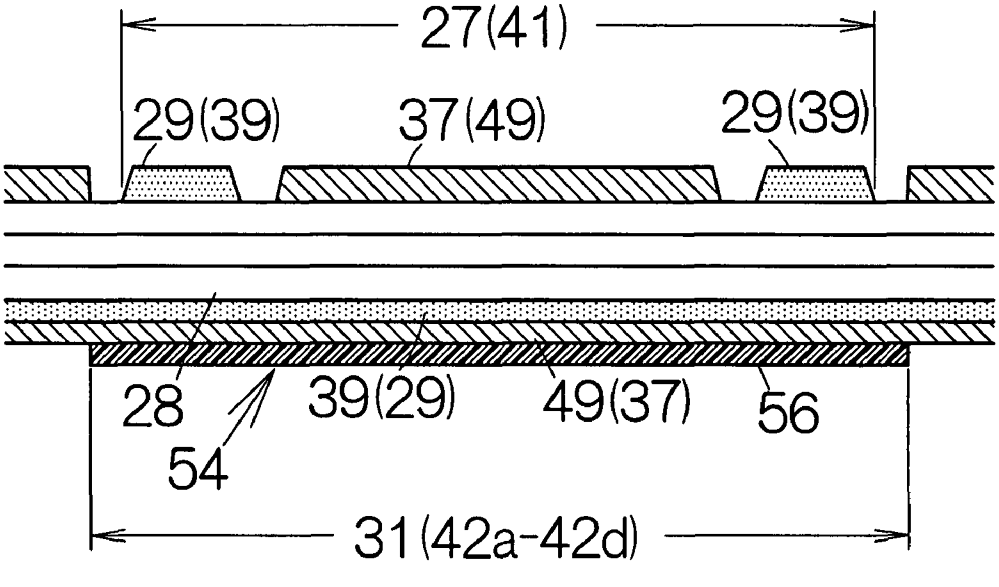
FIG. 20 is a partial vertical sectional view of the printed wiring board.

As shown in FIG. 17, the printed wiring board 17 may accept an insulating film 54 likewise formed on the surface of the first or second backside area 31, 42_a_-42_d_. The insulating film 54 may have a thickness (first thickness) larger than the thickness (second thickness) of the solder resist film 49, 37. A specific insulating film 55 may be overlaid on the surface of the aforementioned solder resist films 49, 37 to establish the insulating film 54. As shown in FIGS. 18 and 19, the insulating films 55 may be printed on the surfaces of the solder resist films 49, 37 in the first and second backside areas 31, 42_a_-42_d_, respectively, for example. The insulating film 55 may have a coefficient of thermal expansion smaller than those of the electrically-conductive films 39, 29 and the substrate 28. The insulating films 55 serve to suppress thermal expansion of the first backside area 31 and the second backside areas 42_a_-42_d_. This results in prevention of flexure of the substrate 28 at the second mounting area 41 and the first mounting areas 30. It should be noted that in the case where the first or second mounting area 30, 41 exhibits a thermal expansion larger than those of the second backside areas 42_a_-42_d_ and the first backside area 31, a specific insulating film 56 may be formed on the surface of the solder resist film 49, 37 in the first or second backside area 31, 42_a_-42_d_, as shown in FIG. 20. The insulating film 56 may have a coefficient of thermal expansion larger than those of the electrically-conductive films 39, 29 and the substrate 28. The aforementioned marking ink film may be utilized as the insulating film 56. The insulating film 56 may be made of any one of the resin materials listed in the aforementioned table.

It should be noted that the present invention may be applied to a printed wiring board and/or a printed circuit board unit employed in an electronic apparatus such as a cellular phone terminal, a personal digital assistance, PDA, a notebook personal computer, or the like, in addition to the printed circuit board unit 16 and the printed wiring board 17 employed in the MP3 player 11.

What is claimed is:

1. A printed wiring board comprising:

a substrate;

terminal pads made of an electrically-conductive material, the terminal pads arranged on a first surface of the substrate for an electronic component to receive terminals of the electronic component; and an electrically-conductive film formed on a second surface defined on a back of the first surface over a back of a mounting area for the electronic component, the mounting area contoured along an outer periphery of arrangement of the terminal pads, an area of the electrically-conductive film depending on a ratio of area of the electrically-conductive material to area of the surface of the substrate within the mounting area, and wherein the electrically-conductive film includes predetermined repetitive patterns including stripes of electronically-conductive film piece arranged at predetermined intervals on the second surface of the substrate.

2. The printed wiring board according to claim 1, comprising:

an electrically-conducive pine formed on the second surface of the substrate outside the back of the mounting area.

3. A printed circuit board unit comprising:

a substrate;

one or more electronic component mounted on a first surface of the substrate;

terminal pads made of an electrically-conductive material, the terminal pads arranged on the first surface of the substrate for the electronic component to receive terminals of the electronic component; and an electrically-conductive film formed on a second surface defined on a back of the first surface over a back of a mounting area for the electronic component, the mounting area contoured along an outer periphery of arrangement of the terminal pads, an area of the electrically-conductive film depending on a ratio of area of the electrically-conductive material to area of the surface of the substrate within the mounting area, and wherein the electrically-conductive film includes predetermined repetitive patterns including stripes of electronically-conductive film piece arranged at predetermined intervals on the second surface of the substrate.

4. The printed circuit board unit according to claim 3, wherein the electronic component is a semiconductor chip package.

5. An electronic apparatus comprising:

an enclosure;

a substrate placed within the enclosure;

at least one electronic component mounted on a first surface of the substrate;

terminal pads made of an electrically-conductive material, the terminal pads arranged on the first surface of the substrate for the electronic component to receive terminals of the electronic component; and an electrically-conductive film formed on a second surface defined on a back of the first surface over a back of a mounting area for the electronic component, the mounting area contoured along an outer periphery of arrangement of the terminal pads, an area of the electrically-conductive film depending on a ratio of area of the electrically-conductive material to area of the surface of the substrate within the mounting area, and wherein the electrically-conductive film includes the predetermined repetitive patterns including stripes of electrically-conductive film piece arranged at predetermined intervals on the second surface of the substrate.

6. The electronic apparatus according to claim 5, wherein the electronic component is a semiconductor chip package.

* * * * *

UNITED STATES PATENT AND TRADEMARK OFFICE

CERTIFICATE OF CORRECTION

PATENT NO. : 8,305,767 B2
APPLICATION NO. : 11/905317
DATED : November 6, 2012
INVENTOR(S) : Naoki Nakamura et al.

It is certified that error appears in the above-identified patent and that said Letters Patent is hereby corrected as shown below:

Column 12, Line 42, In Claim 2, delete “electrically-conducive pine” and insert -- electrically-conductive plane --, therefor.

Signed and Sealed this
Twenty-ninth Day of January, 2013

David J. Kappos
*Director of the United States Patent and Trademark Office*